(12) United States Patent
Luo et al.

(10) Patent No.: US 10,204,677 B1
(45) Date of Patent: Feb. 12, 2019

(54) SUPERCONDUCTING MEMORY SYSTEM WITH STACKED DRIVERS AND DIFFERENTIAL TRANSFORMERS

(71) Applicant: Microsoft Technology Licensing, LLC, Redmond, WA (US)

(72) Inventors: Henry Y. Luo, Baltimore, MD (US); Quentin P. Herr, Ellicott City, MD (US); Randall M. Burnett, Catonsville, MD (US); Donald L. Miller, Export, PA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/923,940

(22) Filed: Mar. 16, 2018

(51) Int. Cl.
*G11C 11/44* (2006.01)
*H01L 39/22* (2006.01)
*H01L 39/02* (2006.01)
*H01L 39/24* (2006.01)
*H01L 39/12* (2006.01)

(52) U.S. Cl.
CPC ............ *G11C 11/44* (2013.01); *H01L 39/025* (2013.01); *H01L 39/223* (2013.01); *H01L 39/12* (2013.01); *H01L 39/2493* (2013.01)

(58) Field of Classification Search
CPC ..... G11C 11/44; H01L 39/025; H01L 39/223; H01L 39/12; H01L 39/2493
See application file for complete search history.

(56) References Cited

U.S. PATENT DOCUMENTS

| 9,443,576 | B1* | 9/2016 | Miller | G11C 11/44 |
| 9,520,181 | B1 | 12/2016 | Miller et al. | |
| 9,613,699 | B1* | 4/2017 | Reohr | G11C 15/04 |
| 9,972,380 | B2* | 5/2018 | Ambrose | G11C 11/44 |
| 2015/0043273 | A1 | 2/2015 | Naaman et al. | |
| 2015/0094207 | A1 | 4/2015 | Herr et al. | |
| 2016/0267964 | A1 | 9/2016 | Herr et al. | |
| 2017/0229167 | A1 | 8/2017 | Reohr et al. | |

\* cited by examiner

*Primary Examiner* — Pho M Luu
(74) *Attorney, Agent, or Firm* — Ranjeev Singh; Singh Law, PLLC

(57) ABSTRACT

A memory system including an array of memory cells may include a set of word-lines, and a set of return word-lines coupled to the memory cells in the array of memory cells. The memory system may further include a set of bit-lines coupled to the memory cells. Each of the memory cells may include a memory storage element including a readout superconducting quantum interference device (SQUID), and a magnetic Josephson Junction (MJJ), and where the memory storage element may further include a differential transformer coupled in series with the MJJ such that in response to a bit-line current applied to at least one of the set of bit-lines and a word-line current applied to at least one of the set of word-lines, the differential transformer is configured to induce a flux in the at least one readout SQUID.

20 Claims, 7 Drawing Sheets

SUPERCONDUCTING MEMORY SYSTEM WITH STACKED DRIVERS AND DIFFERENTIAL TRANSFORMERS

BACKGROUND

Semiconductor based integrated circuits used in electronic devices, such as random access memories, include digital circuits based on complimentary metal-oxide semiconductor (CMOS) technology. CMOS technology, however, is reaching its limits in terms of the device size. In addition, leakage current in CMOS based memories is causing high power consumption even when these memories are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based memory is a superconducting logic-based memory.

SUMMARY

In one example, the present disclosure relates to a memory system comprising an array of memory cells arranged in rows and columns. The memory system may further include a set of word-lines, where each of the set of the word-lines is coupled to a first plurality of memory cells in at least one row of the array of memory cells. The memory system may further include a set of return word-lines, where each of the set of return word-lines is coupled to the first plurality of memory cells in the at least one row of the array of memory cells. The memory system may further include a set of bit-lines, wherein each of the set of the bit-lines is coupled to a second plurality of memory cells in at least one column of the array of memory cells. Each of the memory cells may further comprise at least one memory storage element comprising at least one readout superconducting quantum interference device (SQUID), and a magnetic Josephson Junction (MJJ), and wherein the at least one memory storage element further comprises a differential transformer coupled in series with the MJJ such that in response to a bit-line current applied to at least one of the set of the bit-lines and a word-line current applied to at least one of the set of word-lines coupled to at least one of the set of return word lines, the differential transformer is configured to induce a flux in the at least one readout SQUID.

In another aspect, a method in a memory system including an array of memory cells arranged in rows and columns, a set of word-lines, where each of the set of word-lines is coupled to a first plurality of memory cells in at least one row of the array of memory cells, a set of return word-lines, where each of the set of return word-lines is coupled to the first plurality of memory cells in the at least one row of the array of memory cells, a set of bit-lines, where each of the set of the bit-lines is coupled to a second plurality of memory cells in at least one column of the array of memory cells, where each of the first plurality of the memory cells and each of the plurality of the second plurality of the memory cells comprises at least one memory storage element comprising at least one readout superconducting quantum interference device (SQUID), and a magnetic Josephson junction (MJJ), and wherein the at least one memory storage element further comprises a differential transformer coupled in series with the MJJ is provided. The method may include performing a read operation in response to a bit-line current applied to at least one of the set of the bit-lines and a word-line current applied to at least one of the set of word-lines coupled to at least one of the set of return word lines, where the differential transformer is configured to induce a flux in the at least one readout SQUID.

In yet another aspect, the present disclosure relates to a memory system comprising an array of memory cells arranged in rows and columns. The memory system may further include a set of word-lines, where each of the set of the word-lines is coupled to a first plurality of memory cells in at least one row of the array of memory cells. The memory system may further include a set of return word-lines, where each of the set of return word-lines is coupled to the first plurality of memory cells in the at least one row of the array of memory cells, and where each of the set of word-lines and each of the set of return word-lines is coupled to a respective stacked driver configured to provide current to a respective row of the array of memory cells. The memory system may further include a set of bit-lines, where each of the set of the bit-lines is coupled to a second plurality of memory cells in at least one column of the array of memory cells. Each of the memory cells may further comprise at least one memory storage element comprising at least one memory storage element comprising at least one readout superconducting quantum interference device (SQUID), and a magnetic Josephson Junction (MJJ), and wherein the at least one memory storage element further comprises a differential transformer coupled with the MJJ such that in response to a bit-line current applied to at least one of the set of the bit-lines and a word-line current applied, via a respective stacked driver, to at least one of the set of word-lines coupled to at least one of the set of return word lines, the differential transformer is configured to induce a flux in the at least one readout SQUID.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
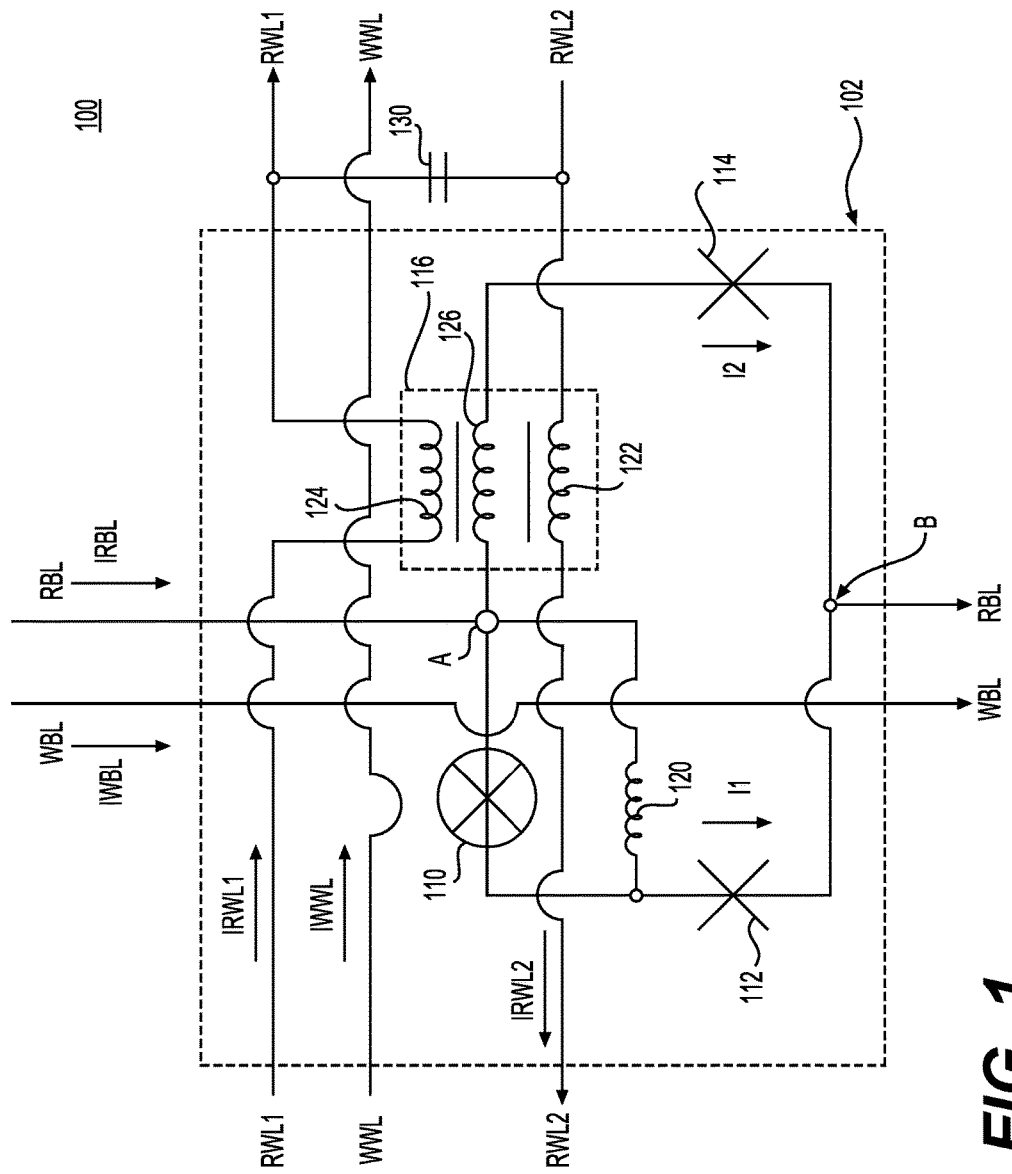
FIG. 1 shows a diagram of a memory cell in accordance with one example.

Examples described in this disclosure relate to superconducting logic based memory systems, including Josephson Magnetic Random Access Memories (JMRAMs). Certain examples relate to a superconducting memory system including stacked drivers and differential transformers. Other examples relate to memory cells for use in the memory system. Certain examples further relate to reciprocal quantum logic (RQL) compatible JMRAMs. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. As an example, at temperatures below Tc (e.g., 9.3 K), niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

Microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells. As an example, such a memory cell may be read out using a superconducting quantum interference device (SQUID). The memory cell may include a SQUID and a magnetic Josephson junction (MJJ) device, which may be configured such that under the application of appropriate amounts of current bias and magnetic flux, the memory cell may be in a logic '1' state or in a logic '0' state. In one example, if the memory cell is in the logic '1' state, under the application of a current via a word-line, the SQUID may transition into a "voltage state." A sense amplifier coupled to the memory cell may sense the voltage as being representative of the logic '1' state. The logic '0' state may correspond to a "substantially zero-voltage state," such that in the logic '0' state, despite the application of a current via a word-line, the SQUID may stay in the "substantially zero-voltage state." The sense amplifier may sense this as being representative of the logic '0' state.

Memory cells may be arranged in rows and columns, such that each row can be activated by a common flux bias (e.g., a read word-line signal) and each bit-line may form a transmission line that may propagate the output of the memory cells in a voltage state to a sense amplifier at one end of the column. Memory cells in a column may be serially biased by a common current source; for example, a flux pump.

FIG. 1 shows a diagram of a memory cell 100 in accordance with one example. In one example, memory cell 100 may include a memory storage element 102 including at least one magnetic Josephson junction (MJJ) device 110 and at least two Josephson junctions 112 and 114 as shown in FIG. 1. In one example, each of Josephson junctions 112 and 114 may be a superconductor-insulator-superconductor (SIS) type of Josephson junction. Memory storage element 102 may further include a differential transformer 116. Differential transformer 116 may include two inductors 122 and 124 and an inductor 126. In one example, Josephson junctions 112 and 114 may form a readout superconducting quantum interference device (SQUID). In one example, MJJ device 110 may be a superconductor with at least two magnetic barrier layers (e.g., ferromagnetic barriers). In one example, the at least two magnetic barrier layers (e.g., ferromagnetic barriers) may be compatible with single flux quantum (SFQ) pulse-based circuits. In another example, there could be two magnetic barrier layers, with one of them having a fixed magnetic state and the other one of them having a bi-stable magnetic state. In one example, MJJ device 110 may include a non-magnetic layer sandwiched between a free magnetic layer and a fixed magnetic layer. There could be intervening layers between any of these layers. In one example, the free magnetic layer may have very soft magnetic properties to allow for switching of the magnetization direction in response to small magnetic fields. The free magnetic layer may include a magnetic alloy doped with at least one of Vanadium, Zirconium, Molybdenum, or Hafnium. The fixed magnetic layer may be formed using an un-doped magnetic alloy. In another example, the fixed magnetic layer may have a lower amount of doping than the free magnetic layer. The fixed magnetic layer may have a larger hysteresis than the hysteresis for the free magnetic layer. The thickness of fixed magnetic layer may be selected to enable the transition of the MJJ device between a "zero state" and a "π state." As an example, magnetic layers may have a thickness of 10 Angstroms to 25 Angstroms. The magnetic alloy may be a Ni—Fe allow, a Ni—Co alloy, an Fe—Co alloy, or a Co—Ni—Fe alloy. In another example, magnetic layers may include a Ni—Fe alloy doped with zirconium (Zr). In other examples, the magnetic layers may include a Ni—Fe alloy doped with molybdenum or hafnium. The non-magnetic layer may include at least one of vanadium (V), molybdenum (Mo), copper (Cu), aluminum (Al), tantalum (Ta), or chromium (Cr). Any of the layers described as part of the present disclosure may be formed using physical vapor deposition (PVD) techniques, such as sputtering. Although certain number of layers of the MJJ device 110 arranged in a certain manner are described, there could be more or fewer layers arranged differently.

With continued reference to FIG. 1, memory cell 100 may be coupled to word-lines and bit-lines for performing various memory operations, including, for example read and write operations. As an example, a read word-line (RWL1) for performing a read operation may be coupled to memory cell 100. Read word-line's return (e.g., return read-word line RWL2) may also be coupled to memory cell 100 via differential transformer 116. A write word-line (WWL) for performing a write operation may be coupled to memory cell 100. The write word-line may be magnetically coupled to MJJ 110. In addition, a read bit-line (RBL) for performing a read operation may be coupled to memory cell 100. A write bit-line (WBL) for performing a write operation may also be coupled to memory cell 100. The write bit-line may be magnetically coupled to MJJ 110. In one example, the coupling with MJJ 110 may be such that the magnetization of the magnetic barrier layers of the MJJ can be changed by the application of a local write word-line current and/or by the application of a write bit-line current.

In one example, MJJ 110 may be in a first state (e.g., corresponding to a first configuration of magnetization of the at least one magnetic barrier layer) and a second state (e.g., corresponding to a second configuration of magnetization of the at least one magnetic barrier layer), where the first configuration of the magnetization may be substantially different from the second configuration of the magnetization. In one example, MJJ 110 may be in one state when the magnetization of each of the at least two magnetic barrier layers oppose each other. In one example, this state may be the "zero state" of MJJ 110. MJJ 110 may be in a different state when the magnetization of each of the at least two magnetic barrier layers support each other. In one example, this state may be the "π state." In the "π state," MJJ 110 may apply flux to JJs 112 and 114 such that under the application of a word read current, the induced currents in memory storage element 102, due to the flux generated by MJJ 110 and by the coupling of the word-read current via differential transformer 116, may combine with a bit-read current applied at node A to trigger the Josephson junctions 112 and 114 sending a readout SQUID into voltage state. This voltage may generate a current along the read bit-line, which may act as a transmission line with a certain impedance. This current may be sensed using a sense amplifier. In one example, during a write operation, the write word-line (WWL) and the write bit-line (WBL) may receive current from the respective drivers (described later). The local write word-line current and the local write bit-line current may change a magnetization associated with at least one of the magnetic barrier layers of MJJ 110. When a magnetic field (e.g., created by the local word-line current and the local bit-line current) causes the respective magnetization of the magnetic barrier layers to support each other, then MJJ 110 may be in the "π state." Conversely, when this magnetic field (e.g., created by the local word-line and the local bit-line currents) causes the respective magnetization of the at least one of the magnetic barriers to oppose each other, then MJJ 110 may be in a "zero state." In one example, the "π state" may correspond a logic '1' state and the "zero state" may correspond to a logic '0' state of memory cell 100.

With continued reference to FIG. 1, during a read operation, the read word-line (RWL1) may receive current from the respective word-line driver and the read bit-line (RBL) may receive current from a bit-line current source. In one example, read word-line (RWL1) may be coupled to inductor 124 and the return read-word line (RWL2) may be coupled to inductor 122. In this example, inductor 124 may act as a primary coupling of differential transformer 116 with respect to the read word-line and inductor 122 may act as a primary coupling of differential transformer 116 with respect to the return read-word line. As shown in FIG. 1, read word-line (RWL1) and return read-word line (RWL2) may also be coupled to each other via a capacitive element 130. In one example, read bit-line (RBL) may be coupled via Node A to memory storage element 102 and provide a local bit-line current. An amount of the local bit-line current may flow to each of the Josephson junctions (e.g., Josephson junction 112 and Josephson junction 114). In one state (e.g., the π state), MJJ 110 may provide a flux bias to the readout SQUID formed by Josephson junctions 112 and 114 and inductors 122 and 124. During a read operation, this flux bias from MJJ 110 may add to the flux generated by the current flowing through the read word-line (RWL1) and the current flowing through the return read word-line (RWL2) causing the readout SQUID to transition to a voltage state. The differential transformer 116 in series with MJJ 110 may advantageously reduce the amount of flux required to trigger a state of the readout SQUID. In this example, because differential transformer 116 is in series with MJJ 110, the amount of flux contribution from differential transformer 116 is reduced. Consequently, the amount of current required to perform the read operation is reduced. In a second state (e.g., the zero state), MJJ 110 may not provide any flux bias to the readout SQUID formed by Josephson junctions 112 and 114. In this state, in this example, the flux contribution from differential transformer 116 is insufficient to trigger the readout SQUID into the voltage state.

Although FIG. 1 shows a certain number of components arranged in a certain manner, memory cell 100 may include additional or fewer components arranged differently. As an example, although FIG. 1 shows a differential read word-line and a return word-line coupled to a differential transformer 116, differential read word-lines may not be used, and instead of differential transformer 116, a single-ended transformer may be coupled to the read word line.

Figure 2:
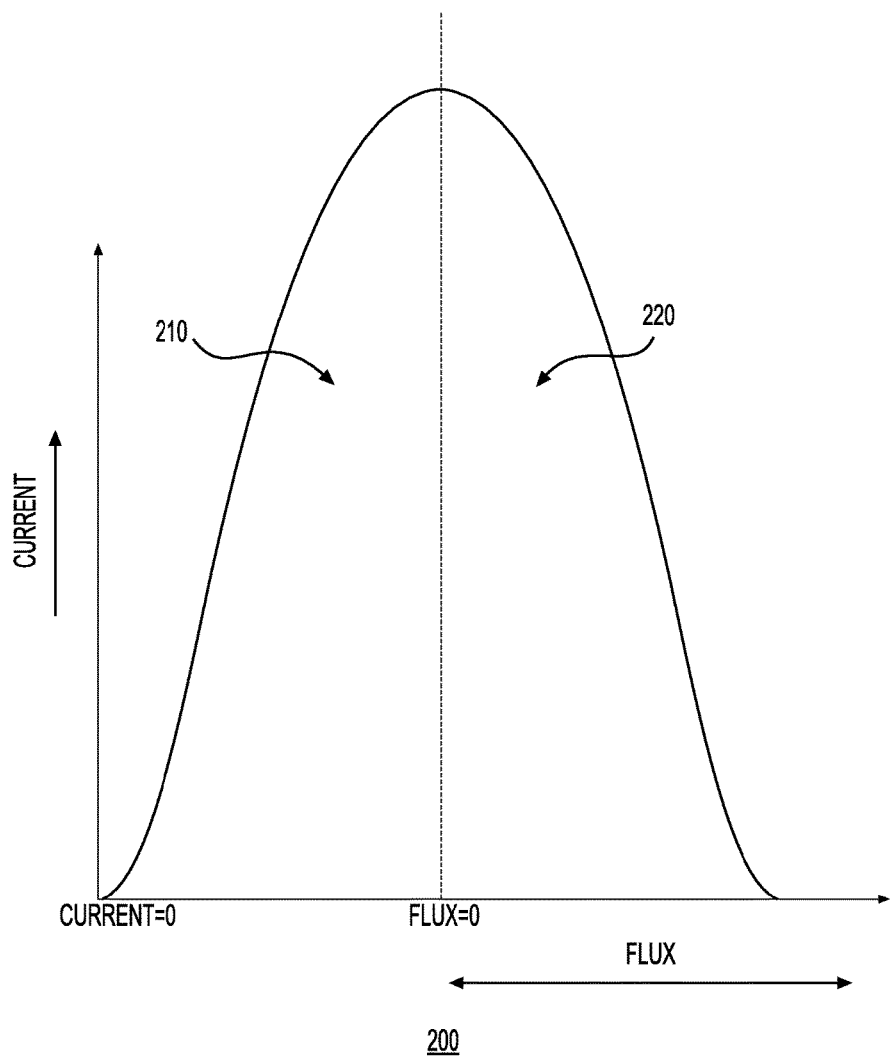
FIG. 2 is a graph depicting a relationship between a current across a SQUID and the flux induced in the SQUID in accordance with one example.

FIG. 2 is a graph depicting a relationship between the current (vertical axis) across the SQUID and the flux (horizontal axis) induced in the SQUID in accordance with this example. Initially, when the current is below the dotted horizontal line the SQUID is in the zero-voltage state 210. Once, the current is applied via the read word line and the read bit line, it adds flux into the SQUID and once the amount of flux exceeds a certain threshold (e.g., the vertical line) that shifts the state of the SQUID to the voltage state 220.

Figure 3:
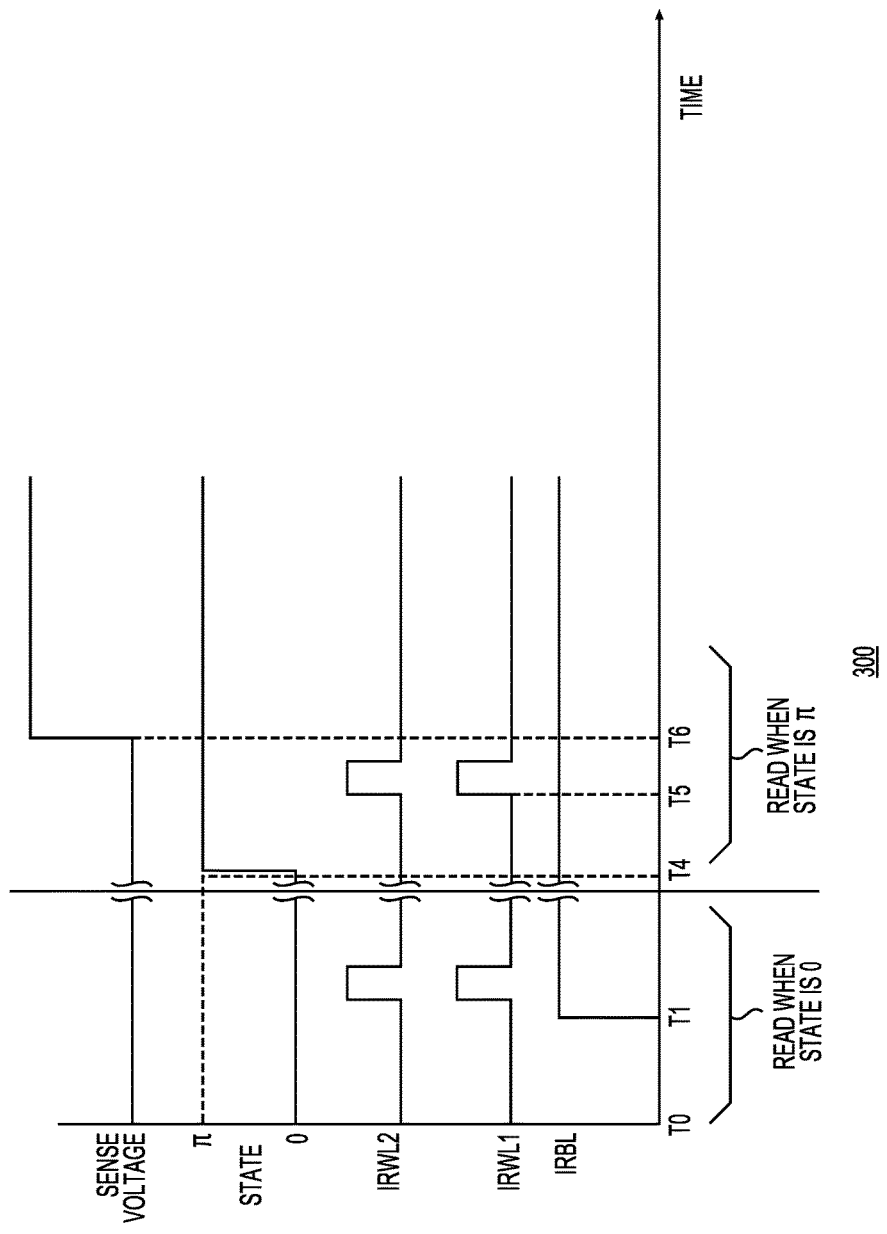
FIG. 3 shows a timing diagram corresponding to a memory cell in accordance with one example.

FIG. 3 shows a timing diagram corresponding to memory cell 100 of FIG. 1 in accordance with one example. In this example, to simplify the explanation of the read operation, it is assumed that the critical current of both Josephson junctions (112 and 114) is IC. At time T0, in the absence of any current from MJJ 110 or the read word line, DC current (IRBL) is provided to the read bit line (RBL), which is split between both legs (the leg including Josephson junction 112 and the other leg including Josephson junction 114 of FIG. 1). Thus, in this example, each junction has one half of the IC flowing through it from top to bottom (e.g., from node A to node B); in that case neither junction has sufficient current to trigger. As part of the read operation, certain amount of current (e.g., IRWL1) is applied (time T1) to read word line (RWL1) and that current (e.g., (RWL2) also flows through return read word line (RWL2) and that may induce one third of the IC into the SQUID. Because this is a circulating current, it will be added to one Josephson junction and subtracted from the other Josephson junction in the SQUID. Thus, in this example, the amount of current through one junction (e.g., Josephson junction 112) will be one half of IC+one third of IC; the amount of current in the other junction (e.g., Josephson junction 114) will be one half of IC-one third of IC. At this point, however, the total amount of current in each junction still does not exceed the amount of critical current (IC). This state corresponds to the "0" state shown in FIG. 2. After an intervening write operation (time T4), assuming MJJ 110 is in the 1T state, and if MJJ 110 was tuned to also provide approximately one third of IC amount of current into the SQUID, then the amount of current through one of the junctions (e.g., Josephson junction 112) will be one half of IC+one third of IC+one third of IC. As explained earlier, in this example, this is the result of one half of IC flowing from the read bit line, one third of IC from RWL1/RWL2 current pulses and one third of IC provided by MJJ 110. This amount of current being substantially equal to or greater than the amount of the IC current will activate the junction that in turn will send the SQUID into a voltage state (time T6), which will indicate a reading of logical "one" value.

The change in an output voltage, current, or any other parameter of memory storage element 102 may be sensed using a sense amplifier. In one example, the presence or absence of a current pulse, once amplified by the sense amplifier, may determine the state of memory cell 100 as logic '0' or logic '1'. As an example, the logic '1' state may correspond to a "voltage state," in which a sense amplifier coupled to the memory cell may sense the voltage as being representative of the logic '1' state. The logic '0' state may correspond to a "substantially zero-voltage state," such that the sense amplifier may sense this as being representative of the logic '0' state. In this example, the voltage of memory cell 100 depends upon the application of the current via both the read word-line (RWL1) and the return read-word line (RWL2). Nodes A and B, shown in FIG. 1, may be viewed as terminals of a radio frequency transmission line. The impedance of memory cell 100 may be determined based on the inductance (L), from node A to node B, and by the capacitance (C) of memory cell 100 with respect to a ground using the equation:

$$Z = \sqrt{\frac{L}{C}}.$$

Although FIG. 1 shows a certain number of components of a memory cell 100 arranged in a certain manner, there could be more or fewer number of components arranged differently.

Figure 4:
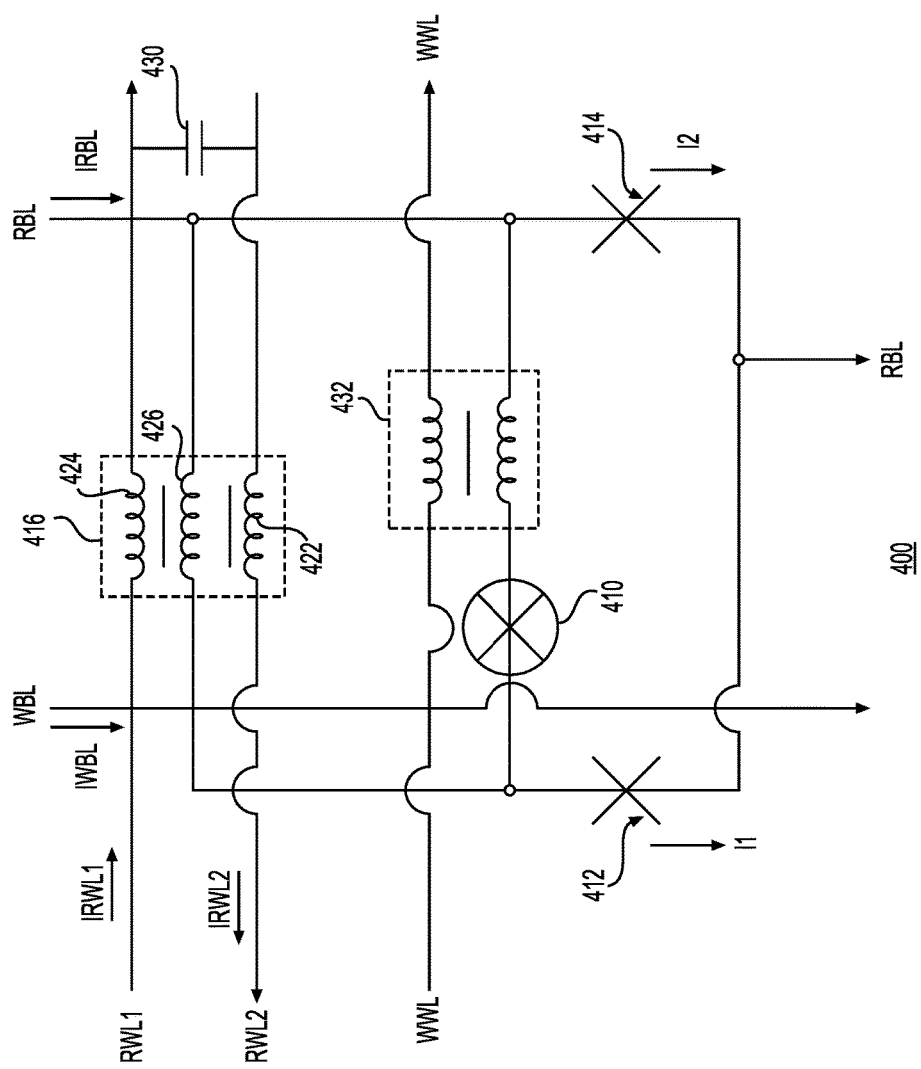
FIG. 4 shows a diagram of another example of a memory cell.

FIG. 4 shows a diagram of a memory cell 400 in accordance with one example. In one example, memory cell 400 may include a memory storage element 402 including at least one magnetic Josephson junction (MJJ) device 410 and at least two Josephson junctions 412 and 414 as shown in FIG. 4. In one example, each of Josephson junctions 412 and 414 may be a superconductor-insulator-superconductor (SIS) type of Josephson junction. Memory storage element 402 may further include a differential transformer 416. Differential transformer 416 may include two primary couplings 422 and 424 and a secondary coupling 426. In this example, memory storage element may further include another transformer 432. In one example, Josephson junctions 412 and 414 may form a readout superconducting quantum interference device (SQUID). In one example, MJJ device 410 may be a superconductor with at least two magnetic barrier layers (e.g., ferromagnetic barriers) that are compatible with single flux quantum (SFQ) pulse-based circuits. In another example, there could be two magnetic barrier layers, with one of them having a fixed magnetic state and the other one of them having a bi-stable magnetic state. Other types of materials, such as aluminum may be used with Niobium for the superconductors.

In one example, MJJ device 410 may include a non-magnetic layer sandwiched between a free magnetic layer and a fixed magnetic layer. There could be intervening layers between any of these layers. In one example, the free magnetic layer may have very soft magnetic properties to allow for switching of the magnetization direction in response to small magnetic fields. The free magnetic layer may include a magnetic alloy doped with at least one of Vanadium, Zirconium, Molybdenum, or Hafnium. The fixed magnetic layer may be formed using an un-doped magnetic alloy. In another example, the fixed magnetic layer may have a lower amount of doping than the free magnetic layer. The fixed magnetic layer may have a larger hysteresis than the hysteresis for the free magnetic layer. The thickness of fixed magnetic layer may be selected to enable the transition of the MJJ device between a "zero state" and a "π state." As an example, magnetic layers may have a thickness of 10 Angstroms to 25 Angstroms. The magnetic alloy may be a Ni—Fe allow, a Ni—Co alloy, an Fe—Co alloy, or a Co—Ni—Fe alloy. In another example, magnetic layers may include a Ni—Fe alloy doped with zirconium (Zr). In other examples, the magnetic layers may include a Ni—Fe alloy doped with molybdenum or hafnium. The non-magnetic layer may include at least one of vanadium (V), molybdenum (Mo), copper (Cu), aluminum (Al), tantalum (Ta), or chromium (Cr). Any of the layers described as part of the present disclosure may be formed using physical vapor deposition (PVD) techniques, such as sputtering. Although a certain number of layers of the MJJ device 410 arranged in a certain manner are described, there could be more or fewer layers arranged differently.

With continued reference to FIG. 4, memory cell 400 may be coupled to word-lines and bit-lines for performing various memory operations, including, for example, read and write operations. As an example, a read word-line (RWL1) for performing a read operation may be coupled to memory cell 400. Read word-line's return (e.g., return read-word line RWL2) may also be coupled to memory cell 400 via a differential transformer 416. A write word-line (WWL) for performing a write operation may be coupled to memory cell 400. In addition, a read bit-line (RBL) for performing a read operation may be coupled to memory cell 400. A write bit-line (WBL) for performing a write operation may also be coupled to memory cell 400. The write bit-line may be magnetically coupled to MJJ 410. In one example, the coupling with MJJ 410 may be such that the magnetization of at least one of the magnetic barrier layers of MJJ 410 can be changed by the application of a local write word-line current and/or by the application of a local write bit-line current. The write word-line may be magnetically coupled to MJJ 410. In one example, the coupling with MJJ 410 may be such that the magnetization of at least one of the magnetic barrier layers of the MJJ can be changed by the application of a local write word-line current and/or by the application of a write bit-line current.

In one example, MJJ 410 may be in a first state (e.g., corresponding to a first configuration of magnetization of at least one magnetic barrier layer) and a second state (e.g., corresponding to a second configuration of magnetization of the at least one magnetic barrier layer), where the first configuration of the magnetization may be substantially different from the second configuration of the magnetization. In one example, like MJJ 110 of FIG. 1, MJJ 410 may be in one state when the magnetization of each of the at least two magnetic barrier layers oppose each other. In one example, this state may be the "zero state" of MJJ 410. MJJ 410 may be in a different state when the magnetization of each of the at least two magnetic barrier layers support each other. In one example, this state may be the "π state." In the "π state," MJJ 410 may apply flux to JJs 412 and 414 such that under the application of a word read current, the induced currents, in memory storage element 402, due to the flux generated by MJJ 410 and by the coupling of the word-read current via differential transformer 416, may combine with a bit-read current to trigger the Josephson junctions 412 and 414 into the π state sending a readout SQUID into voltage state (e.g., a 2.5 millivolts state). This voltage may generate a current along the read bit-line, which may act as a transmission line with a certain impedance. This current may be sensed using a sense amplifier. In one example, during a write operation, the write word-line (WWL) and the write bit-line (WBL) may receive current from the respective drivers (described later). The local write word-line current and the local write bit-line current may change the magnetization of at least one of the magnetic barrier layers of MJJ 410. When this magnetic field (e.g., created by the local word-line current and the local bit-line current) causes the respective magnetization of the magnetic barrier layers to support each other, then MJJ 410 may be in the "π state." Conversely, when this magnetic field (e.g., created by the local word-line and the local bit-line currents) causes the respective magnetization of the at least one of the magnetic barrier layers to oppose each other, then MJJ 410 may be in a "zero state." In one example, the "π state" may correspond a logic '1' state and the "zero state" may correspond to a logic '0' state of memory cell 400.

With continued reference to FIG. 4, during a read operation, the read word-line (RWL1) may receive current from the respective word-line driver and the read bit-line (RBL) may receive current from a bit-line current source. In one example, read word-line (RWL1) may be coupled to inductor 424 and the return read-word line (RWL2) may be coupled to inductor 422. In this example, inductor 424 may act a primary coupling of differential transformer 432 with respect to the read word-line and inductor 422 may act as a primary coupling of differential transformer 432 with respect to the return read-word line. As shown in FIG. 4, read word-line (RWL1) and return read-word line (RWL2) may also be coupled to each other via a capacitive element 430. In one example, read bit-line (RBL) may provide a local bit-line current to memory storage element 402. An amount of the local bit-line current may flow to each of the Josephson junctions (e.g., Josephson junction 412 and Josephson junction 414). In one state (e.g., the 1T state), MJJ 410 may provide a flux bias to the readout SQUID formed by Josephson junctions 412 and 414. During a read operation, this flux bias from MJJ 410 may add to the flux generated by the current flowing through the read word-line (RWL1) and the current flowing through the return read word-line (RWL2) causing the readout SQUID to transition to a voltage state. Unlike the example memory cell 100, which has differential transformer 116 in series with the readout SQUID, the example memory cell 400 includes a current divider between the readout SQUID and differential transformer 416. Thus, this example may require more read current to change the state of the SQUID than the read current required for memory cell 100. In a second state (e.g., the zero state), MJJ 410 may not provide any flux bias to the readout SQUID formed by Josephson junctions 412 and 414. In this state, in this example, the flux contribution from differential transformer 416 is insufficient to trigger the readout SQUID into the voltage state.

In this example, in terms of the timing of the read operation associated with memory cell 400, it is similar to as shown in FIG. 3 for the read operation associated with memory cell 100. To simplify the explanation of the read operation, it is assumed that the critical current of both Josephson junctions (412 and 414) is IC. At time T0, in the absence of any flux from MJJ 410 or the read word line, DC current (IRBL) is provided to the read bit line (RBL), which is split almost evenly between both legs (the leg including Josephson junction 412 and the other leg including Josephson junction 414 of FIG. 4). Thus, in this example, each junction has one half of the IC flowing through it from top to bottom; in that case neither junction has sufficient current to trigger. As part of the read operation, certain amount of current is applied (time T1) to read word line (RWL1) and that current also flows through return read word line (RWL2) and that may induce one third of the IC into the SQUID. Because this is a circulating current, it will be added to one Josephson junction and subtracted from the other Josephson junction in the SQUID. Thus, in this example, the amount of current through one junction (e.g., Josephson junction 412) will be one half of IC+one third of IC; the amount of current in the other junction (e.g., Josephson junction 414) will be one half of IC-one third of IC. At this point, however, the total amount of current in each junction still does not exceed the amount of critical current (IC). This state corresponds to the "0" state shown in FIG. 2. After an intervening write operation (time T4), assuming MJJ 410 is in the π state, and if MJJ 410 was tuned to also provide approximately one third of IC amount of current into the SQUID, then the amount of current through one of the junctions (e.g., Josephson junction 412) will be one half of IC+one third of IC+one third of IC. In this example, this is the result of one third of IC flowing from the read bit line, one third of IC from RWL1/RWL2 current pulses and one third of IC provided by MJJ 410. This amount of current being substantially equal to or greater than the amount of the IC current will activate the junction that in turn will send the SQUID into a voltage state (time T6), which will indicate a reading of logical "one" value.

Like the case with memory storage element 102, the change in an output voltage, current, or any other parameter of memory storage element 402 may be sensed using a sense amplifier. In one example, the presence or absence of a current pulse, once detected by the sense amplifier, may determine the state of memory cell 400 as logic '0' or logic '1'. As an example, the logic '1' state may correspond to a "voltage state," in which a sense amplifier coupled to the memory cell may sense the voltage as being representative of the logic '1' state. The logic '0' state may correspond to a "substantially zero-voltage state," such that the sense amplifier may sense this as being representative of the logic '0' state. In this example, the voltage of memory cell 400 depends upon the application of the current via both the read word-line (RWL1) and the return read-word line (RWL2). Although FIG. 4 shows a certain number of components of a memory cell 400 arranged in a certain manner, there could be more or fewer number of components arranged differently. As an example, although FIG. 4 shows a differential read word-line and a return word-line coupled to a differential transformer 416, differential read word-lines may not be used, and instead of differential transformer 416, a single-ended transformer may be coupled to the read word line.

Figure 5:
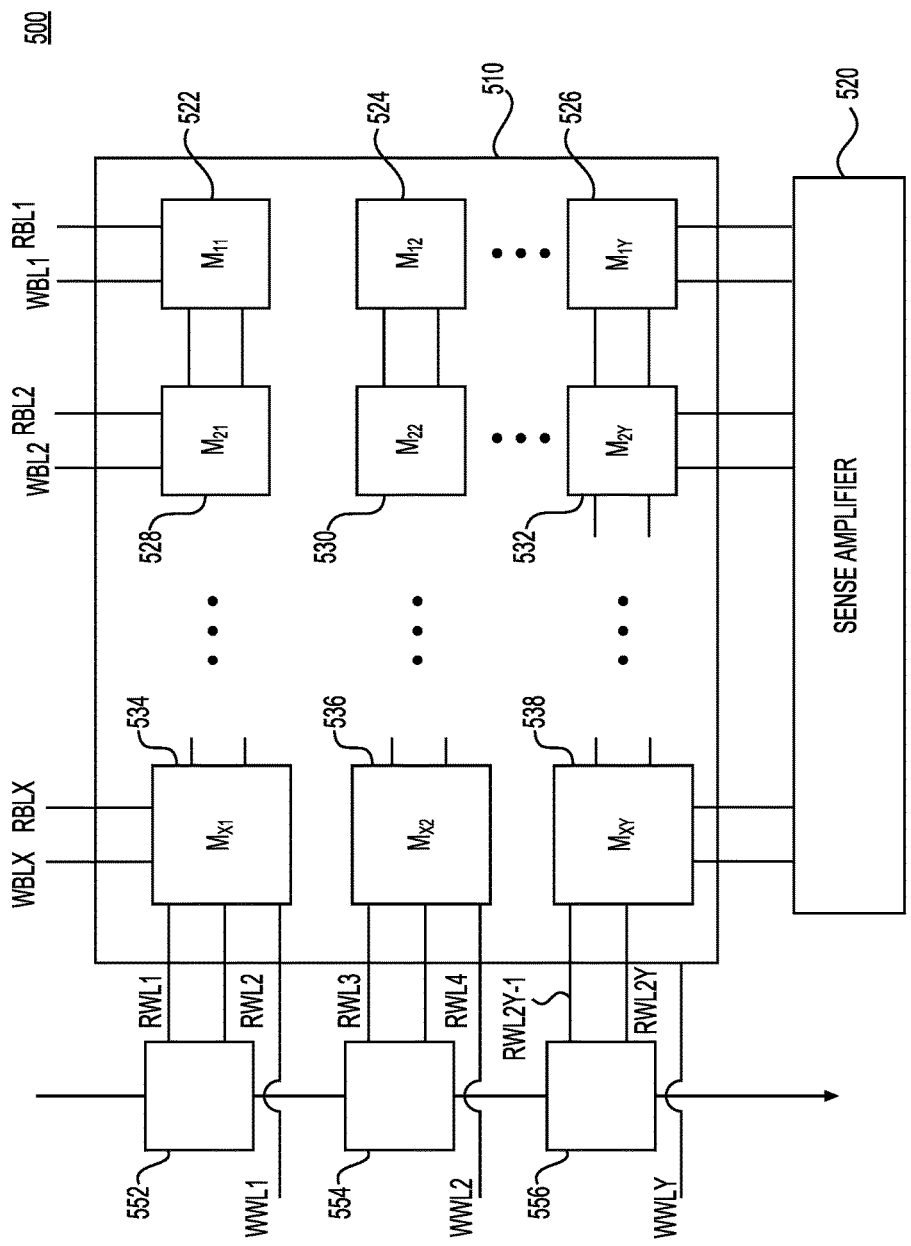
FIG. 5 shows a memory system with stacked drivers in accordance with one example.

FIG. 5 shows a portion of a memory system 500 with stacked drivers in accordance with one example. Memory system 500 may include memory cells organized in an array 510 of memory cells. Array 510 of memory cells may include X columns and Y rows (e.g., each of X and Y is an integer greater than at least 16). As an example, the right most column may include memory cells $M_{11}$ 522, $M_{12}$ 524, and $M_{1Y}$ 526. The column to the left of the right most column may include memory cells $M_{21}$ 528, $M_{22}$ 530, and $M_{2Y}$ 532. The left most column may include memory cells $M_{X1}$ 534, $M_{X2}$ 536, and $M_{XY}$ 538. The top row may include memory cells $M_{X1}$ 534, $M_{21}$ 528, and $M_{11}$ 522. The second row from the top may include memory cells $M_{X2}$ 536, $M_{22}$ 530, and $M_{12}$ 524. The bottom most row may include memory cells $M_{XY}$ 538, $M_{2Y}$ 532, and $M_{1Y}$ 526. Each column may receive read bit-line current and write-bit line current. Each of the memory cells may be either memory cell 100 or memory cell 400. Thus, in this example, each memory cell may be coupled to a read word-line (e.g., RWL1 for the memory cells in the top row) for performing a read operation. Read word-line's return (e.g., return read-word line RWL2 for the memory cells in the top row) may also be coupled. Memory system may further include stacked drivers 552, 554, and 556. Stacked driver 552 may include a switchable voltage source, which may be controlled via a control signal from a row decoder. Similarly, stacked driver 554 may include a switchable voltage source, and stacked driver 556 may include a switchable voltage source. Each of the switchable voltage sources may also be similarly controlled based on control signals received from the row decoder. A sense amplifier (e.g., sense amplifier 520) coupled to the memory cell may sense the voltage as being representative of the logic '1' state. The logic '0' state may correspond to a "substantially zero-voltage state," such that in the logic '0' state, despite the application of a current via a word-line, the readout SQUID may stay in the "substantially zero-voltage state." The sense amplifier (e.g., sense amplifier 520) may sense this as being representative of the logic '0' state.

The differential nature of the read word lines and the return read word lines may advantageously allow the drivers to be stacked. This may result in savings in terms of the chip layout required to route conductors for carrying read current. In the example memory system 500, the read word lines and the corresponding return read word lines are coupled to each other and both the signal and the return portion of the transformer is coupled to the read word-line transformer, thereby decreasing the current requirement of the read word-line drivers. The capacitor (e.g., capacitor 130 or capacitor 430) between the signal and the return line may reduce the necessary capacitance of the transmission line for the correct impedance. The drivers may be configured as SQUIDs that may act as current controlled voltage sources. As an example, when a SQUID turns on, the memory cells get read by current created by the SQUID. Thus, in the example memory system 500, the differential read word-lines and the corresponding return read word lines may advantageously allow the use of stacked read word-line drivers. Although FIG. 5 shows a certain number of components of a memory system 500 arranged in a certain manner, there could be more or fewer number of components arranged differently. As an example, although FIG. 5 shows one stacked driver for every one of the read word line and the corresponding return read word line, a stacked driver may be shared by more than one of the read word line and the corresponding return read word line. Moreover, each readout SQUID may also be coupled to multiple read word line drivers and read word lines. In addition, while the stacked drivers are shown as being arranged to the left of each row, they could be placed on the other side. Similarly, the bit-line current sources and the sense amplifier may be arranged differently. Additionally, like the read word lines and return read word lines, write word lines and the corresponding return write word lines, and write bit lines and the corresponding return write bit lines may also be differential. This may further allow the corresponding drivers or current sources to be stacked, which in turn, may advantageously further result in savings in terms of the chip layout required to route conductors for carrying current. Finally, although FIG. 5 shows read bit line: RBLX, it may not be required because the DC current may be supplied from a node coupled to the sense amplifier.

Figure 6:
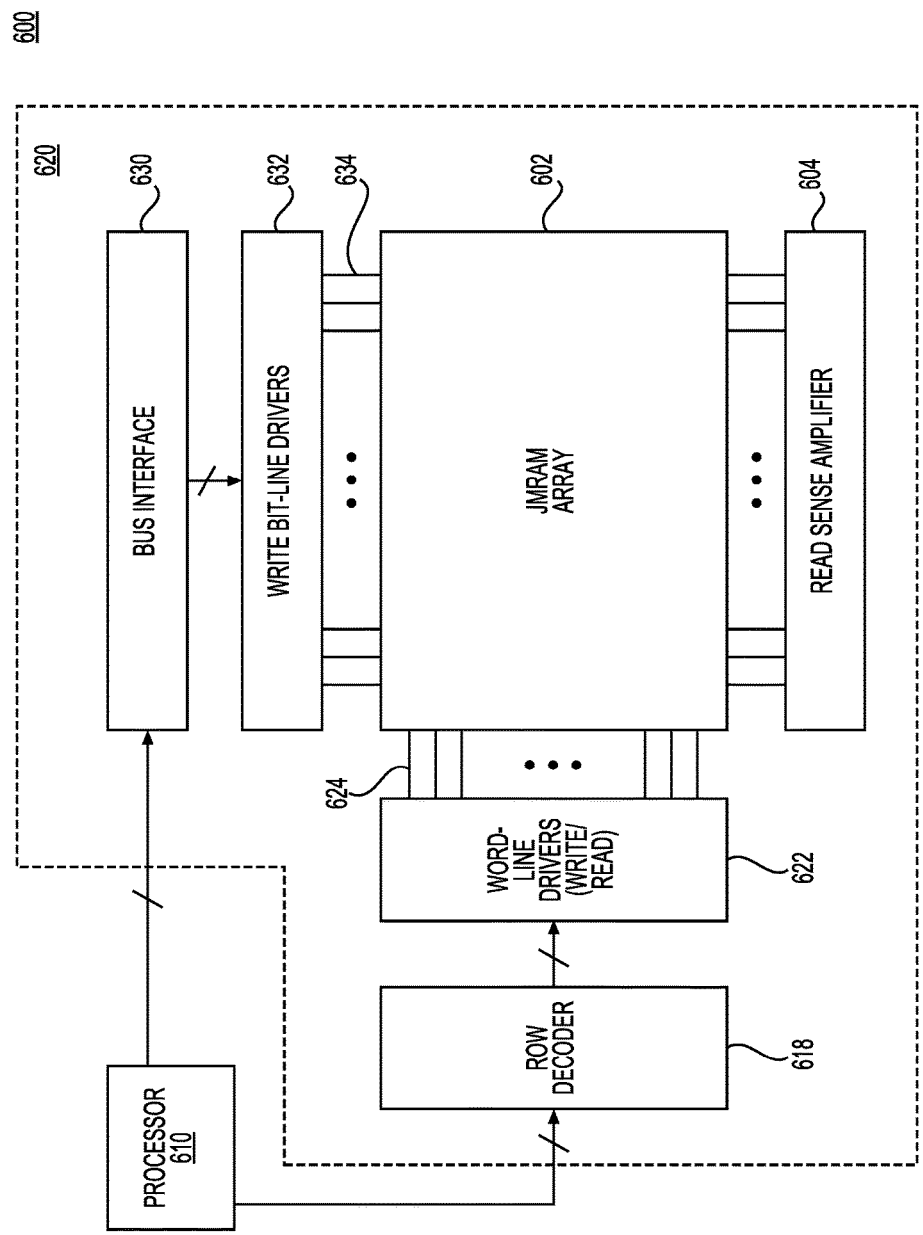
FIG. 6 shows a computing system including a memory, coupled to a processor, in accordance with one example.

FIG. 6 shows a computing system 600 including a processor 610 coupled to a memory 620 in accordance with one example. Processor 610 may perform read or write operations on memory 620 in a manner as explained earlier and further with respect to FIG. 7. Additionally, processor 610 and memory 620 may be used along with other superconducting logic based devices. In general, any superconducting device operating in cryogenic environments and requiring storage of instructions or data may include memory 620. Furthermore, processor 610 need not be in a cryogenic environment; instead, it may operate at non-cryogenic temperatures. In this example, memory 620 may be in a separate cryogenic environment and may be coupled via connectors to processor 610 in a way that the cryogenic environment can be maintained. Memory 620 may be used as part of storage in a data center for delivering cloud-based services, such as software as a service, platform as a service, or other services. Memory system 620 may include an array 602 of memory cells arranged in rows and columns. In one example, array 602 may be an array of memory cells, e.g., Josephson Magnetic Random Access (JMRAM) memory cells. Memory system 620 may further include a row decoder 618 that may be configured to decode row control/address signals. Row decoder 618 may further be coupled to word-line drivers 622. Word-line drivers 622 may include circuitry to provide word-line read/write current to a subset or all of the memory cells associated with a selected word-line for any read or write operations. Word-line drivers 622 may provide such current via word-lines 624. Word-lines 624 may include both read word-lines, return read word-lines and write word-lines. In other words, different word-lines may be used to provide current to the selected memory cells for read or write operations. In one example, word-line drivers 622 may be configured in a stacked configuration like as shown in FIG. 5.

Memory system 620 may further include bus interface 630 that may be configured to receive control signals or other signals from processor 610. Bus interface 630 may further be coupled to bit-line drivers 632. Bit-line drivers 632 may include circuitry to provide bit-line read current to a subset or all of the memory cells associated with a selected bit-line for any read or write operations. Bit-line drivers 632 may provide such current via bit-lines 634. Bit-lines 634 may include both read bit-lines and write bit-lines. In other words, different bit-lines may be used to provide current to the selected memory cells for read or write operations. By using row and column addresses, any of the memory cells could be accessed using an address. Each of the bit-lines (e.g., bit-lines 634) may further be coupled to sense amplifier 604 for sensing bit-lines to determine the logical state of each of the array 602 of memory cells.

The coupling between the array 602 of memory cells and sense amplifier 604 may include radio frequency (RF) transmission lines. The memory cells in each column may be serially current-biased by a common current source (e.g., a flux pump). As described earlier, bit-lines 634 may be used to couple this current to each of the memory cells in a column. Although FIG. 6 shows a certain number of components of computing system 600 arranged in a certain manner, there could be more or fewer number of components arranged differently.

Figure 7:
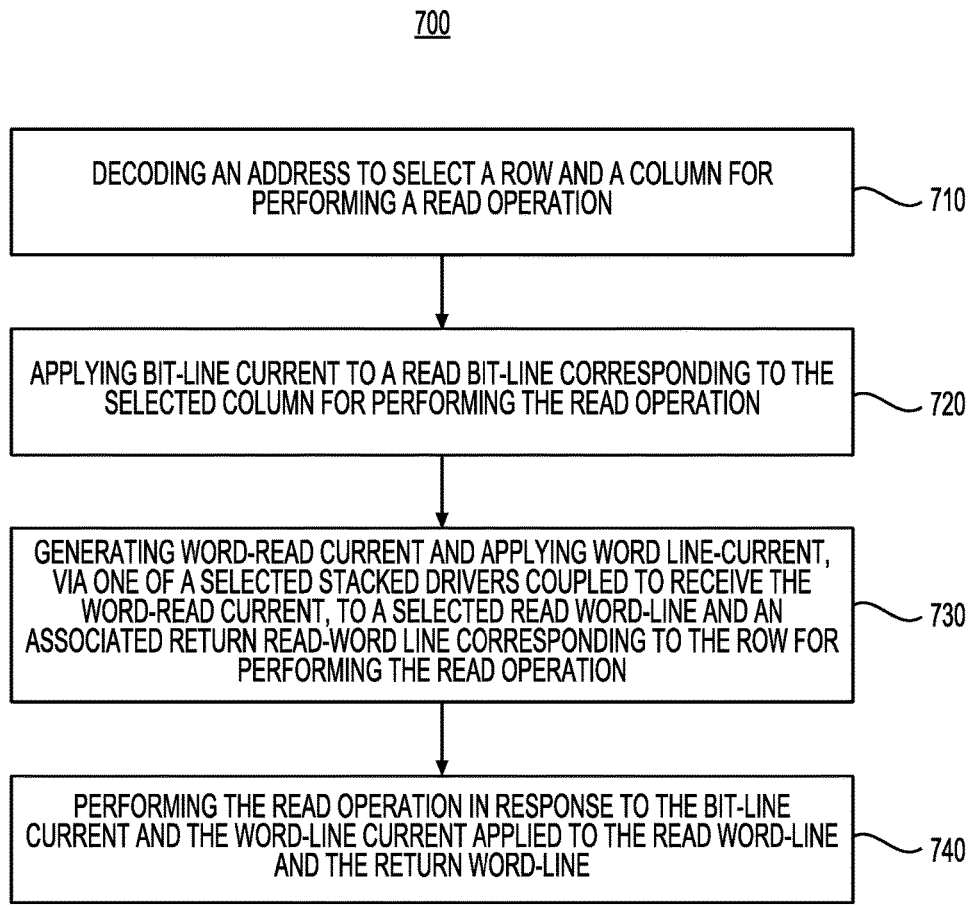
FIG. 7 shows a flow diagram for a method related to a memory system in accordance with one example.

In accordance with one example, FIG. 7 shows a flow chart corresponding to a method 700 associated with memory system 500 and computing system 600. Step 710 may include decoding an address to select a row and a column for performing a read operation. As described earlier, a column decoder may perform this step upon receiving an address from a processor or another device.

Step 720 may include applying bit-line current to a read bit-line corresponding to the selected column for performing a read operation. As explained earlier, a bit-line driver may be used to provide the bit-line current. The bit-line driver may be configured to provide DC current to the bit line (e.g., the RBL of FIG. 1, FIG. 4, of the selected bit line of FIG. 5).

Step 730 may include generating word-read current and applying word-line current, via one of the stacked drivers coupled to receive the word-read current, to a selected read word-line and an associated return read-word line corresponding to the selected row for performing the read operation. As described in FIG. 5, the stacked driver may act as a current source for the read-word line and the applied current may be coupled via a capacitor to the return read-word line.

Step 740 may include performing the read operation in response to the bit-line current and the word-line current applied to the read word-line and the return word-line. Although FIG. 7 shows the steps being performed in a certain order, at least one of the steps may be performed in a different order. In addition, fewer or additional steps may be performed.

In conclusion, the present disclosure relates to a memory system comprising an array of memory cells arranged in rows and columns. The memory system may further include a set of word-lines, where each of the set of the word-lines is coupled to a first plurality of memory cells in at least one row of the array of memory cells. The memory system may further include a set of return word-lines, where each of the set of return word-lines is coupled to the first plurality of memory cells in the at least one row of the array of memory cells. The memory system may further include a set of bit-lines, wherein each of the set of the bit-lines is coupled to a second plurality of memory cells in at least one column of the array of memory cells. Each of the memory cells may further comprise at least one memory storage element comprising at least one readout superconducting quantum interference device (SQUID), and a magnetic Josephson Junction (MJJ), and wherein the at least one memory storage element further comprises a differential transformer coupled in series with the MJJ such that in response to a bit-line current applied to at least one of the set of the bit-lines and a word-line current applied to at least one of the set of word-lines coupled to at least one of the set of return word lines, the differential transformer is configured to induce a flux in the at least one SQUID.

The readout SQUID may include a first Josephson junction (JJ) and a second Josephson junction (JJ), and the differential transformer may comprise a first primary coupling coupled to the at least one of the set of word lines and a second primary coupling coupled to the at least one of the set of the return word-lines.

The memory storage element may be configured to meet or exceed a critical current threshold of the at least one of the first JJ or the second JJ based on a combination of at least a portion of the bit-line current, at least a portion of a current generated by induced flux from the word-line current, and at least a portion of a current provided by the MJJ to the at least one of the first JJ or the second JJ. Prior to the read operation, the at least one memory storage element may be in a first state or a second state, and where the first state may correspond to a logic one state and the second state may correspond to a logic zero state.

The at least one of the set of word-lines may be coupled to the at least one of the set of return word-lines via at least one capacitive element. The at least one of the set of word-lines and the at least one of the set of return word-lines may be connected across a stacked driver configured to provide the word-line current.

The MJJ may comprise at least one magnetic barrier layer, and where the first state comprises a first magnetization state corresponding to a first configuration of magnetization of the at least one magnetic barrier layer and the second state comprises a second magnetization state corresponding to a second configuration of magnetization of the at least one magnetic barrier layer, where the first configuration of the magnetization is different from the second configuration of the magnetization.

In another aspect, a method in a memory system including an array of memory cells arranged in rows and columns, a set of word-lines, where each of the set of word-lines is coupled to a first plurality of memory cells in at least one row of the array of memory cells, a set of return word-lines, where each of the set of return word-lines is coupled to the first plurality of memory cells in the at least one row of the array of memory cells, a set of bit-lines, where each of the set of the bit-lines is coupled to a second plurality of memory cells in at least one column of the array of memory cells, where each of the first plurality of the memory cells and each of the plurality of the second plurality of the memory cells comprises at least one memory storage element comprising at least one readout superconducting quantum interference device (SQUID), and a magnetic Josephson junction (MJJ), and wherein the at least one memory storage element further comprises a differential transformer coupled in series with the MJJ is provided. The method may include performing a read operation in response to a bit-line current applied to at least one of the set of the bit-lines and a word-line current applied to at least one of the set of word-lines coupled to at least one of the set of return word lines, where the differential transformer is configured to induce a flux in the at least one readout SQUID.

The additional aspects of the method may include similar features as noted above in respect to the memory system described above.

In yet another aspect, the present disclosure relates to a memory system comprising an array of memory cells arranged in rows and columns. The memory system may further include a set of word-lines, where each of the set of the word-lines is coupled to a first plurality of memory cells in at least one row of the array of memory cells. The memory system may further include a set of return word-lines, where each of the set of return word-lines is coupled to the first plurality of memory cells in the at least one row of the array of memory cells, and where each of the set of word-lines and each of the set of return word-lines is coupled to a respective stacked driver configured to provide current to a respective row of the array of memory cells. The memory system may further include a set of bit-lines, where each of the set of the bit-lines is coupled to a second plurality of memory cells in at least one column of the array of memory cells. Each of the memory cells may further comprise at least one memory storage element comprising at least one memory storage element comprising at least one readout superconducting quantum interference device (SQUID), and a magnetic Josephson Junction (MJJ), and wherein the at least one memory storage element further comprises a differential transformer coupled with the MJJ such that in response to a bit-line current applied to at least one of the set of the bit-lines and a word-line current applied, via a respective stacked driver, to at least one of the set of word-lines coupled to at least one of the set of return word lines, the differential transformer is configured to induce a flux in the at least one readout SQUID.

The readout SQUID may include a first Josephson junction (JJ) and a second Josephson junction (JJ), and the differential transformer may comprise a first primary coupling coupled to the at least one of the set of word lines and a second primary coupling coupled to the at least one of the set of the return word-lines.

The memory storage element may be configured to meet or exceed a critical current threshold of the at least one of the first JJ or the second JJ based on a combination of at least a portion of the bit-line current, at least a portion of a current generated by induced flux from the word-line current, and at least a portion of a current provided by the MJJ to the at least one of the first JJ or the second JJ. Prior to the read operation, the at least one memory storage element may be in a first state or a second state, and where the first state may correspond to a logic one state and the second state may correspond to a logic zero state.

The at least one of the set of word-lines may be coupled to the at least one of the set of return word-lines via at least one capacitive element. The at least one of the set of word-lines may be coupled to the at least one of the set of return word-lines via at least one capacitive element.

The MJJ may comprise at least one magnetic barrier layer, and where the first state comprises a first magnetization state corresponding to a first configuration of magnetization of the at least one magnetic barrier layer and the second state comprises a second magnetization state corresponding to a second configuration of magnetization of the at least one magnetic barrier layer, where the first configuration of the magnetization is different from the second configuration of the magnetization.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 710, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A memory system comprising:
an array of memory cells arranged in rows and columns;
a set of word-lines, wherein each of the set of the word-lines is coupled to a first plurality of memory cells in at least one row of the array of memory cells;
a set of return word-lines, wherein each of the set of return word-lines is coupled to the first plurality of memory cells in the at least one row of the array of memory cells; and
a set of bit-lines, wherein each of the set of the bit-lines is coupled to a second plurality of memory cells in at least one column of the array of memory cells, wherein each of the first plurality of the memory cells and each of the second plurality of the memory cells comprises:
at least one memory storage element comprising at least one readout superconducting quantum interference device (SQUID), and a magnetic Josephson Junction (MJJ), and wherein the at least one memory storage element further comprises a differential transformer coupled in series with the MJJ such that in response to a bit-line current applied to at least one of the set of the bit-lines and a word-line current applied to at least one of the set of word-lines coupled to at least one of the set of return word lines, the differential transformer is configured to induce a flux in the at least one readout SQUID.

2. The memory system of claim 1, wherein the at least one readout SQUID comprises a first Josephson junction (JJ) and a second Josephson junction (JJ), and wherein the differential transformer comprises a first primary coupling coupled to the at least one of the set of word lines and a second primary coupling coupled to the at least one of the set of the return word-lines.

3. The memory system of claim 2, wherein the memory storage element is configured to meet or exceed a critical current threshold of the at least one of the first JJ or the second JJ based on a combination of at least a portion of the bit-line current, at least a portion of a current generated by induced flux from the word-line current, and at least a portion of a current provided by the MJJ to the at least one of the first JJ or the second JJ.

4. The memory system of claim 3, wherein prior to the read operation, the at least one memory storage element is in a first state or a second state, and wherein the first state corresponds to a logic one state and the second state corresponds to a logic zero state.

5. The memory system of claim 1, wherein the at least one of the set of word-lines is coupled to the at least one of the set of return word-lines via at least one capacitive element.

6. The memory system of claim 1, wherein the at least one of the set of word-lines and the at least one of the set of return word-lines is connected across a stacked driver configured to provide the word-line current.

7. The memory system of claim 1, wherein the MJJ comprises at least one magnetic barrier layer, and wherein the first state comprises a first magnetization state corresponding to a first configuration of magnetization of the at least one magnetic barrier layer and the second state comprises a second magnetization state corresponding to a second configuration of magnetization of the at least one magnetic barrier layer, and wherein the first configuration of the magnetization is different from the second configuration of the magnetization.

8. A method in a memory system comprising an array of memory cells arranged in rows and columns, a set of word-lines, wherein each of the set of word-lines is coupled to a first plurality of memory cells in at least one row of the array of memory cells, a set of return word-lines, wherein each of the set of return word-lines is coupled to the first plurality of memory cells in the at least one row of the array of memory cells, a set of bit-lines, wherein each of the set of the bit-lines is coupled to a second plurality of memory cells in at least one column of the array of memory cells, wherein each of the first plurality of the memory cells and each of the plurality of the second plurality of the memory cells comprises at least one memory storage element comprising at least one readout superconducting quantum interference device (SQUID), and a magnetic Josephson junction (MJJ), and wherein the at least one memory storage element further comprises a differential transformer coupled in series with the MJJ, the method comprising:
performing a read operation in response to a bit-line current applied to at least one of the set of the bit-lines and a word-line current applied to at least one of the set of word-lines coupled to at least one of the set of return word lines, wherein the differential transformer is configured to induce a flux in the at least one readout SQUID.

9. The method of claim 8, wherein the at least one readout SQUID comprises a first Josephson junction (JJ) and a second Josephson junction (JJ), and wherein the differential transformer comprises a first primary coupling coupled to the at least one of the set of word lines and a second primary coupling coupled to the at least one of the set of the return word-lines.

10. The method of claim 8, wherein the read operation further comprises meeting or exceeding a critical current threshold of the at least one of the first JJ or the second JJ by providing a combination of at least a portion of the bit-line current, at least a portion of a current generated by induced flux from the word-line current, and at least a portion of a current provided by the MJJ to the at least one of the first JJ or the second JJ.

11. The method of claim 8, wherein prior to the read operation, the at least one memory storage element is in a first state or a second state, and wherein the first state corresponds to a logic one state and the second state corresponds to a logic zero state.

12. The method of claim 8, wherein the at least one of the set of word-lines is coupled to the at least one of the set of return word-lines via at least one capacitive element.

13. The method of claim 8, wherein the at least one of the set of word-lines and the at least one of the set of return word-lines is connected across a stacked driver configured to provide the word-line current.

14. The method of claim 8, wherein the MJJ comprises at least one magnetic barrier layer, and wherein the first state comprises a first magnetization state corresponding to a first configuration of magnetization of the at least one magnetic barrier layer and the second state comprises a second magnetization state corresponding to a second configuration of magnetization of the at least one magnetic barrier layer, and wherein the first configuration of the magnetization is substantially different from the second configuration of the magnetization.

15. A memory system comprising:
an array of memory cells arranged in rows and columns;
a set of word-lines, wherein each of the set of the word-lines is coupled to a first plurality of memory cells in at least one row of the array of memory cells;
a set of return word-lines, wherein each of the set of return word-lines is coupled to the first plurality of memory cells in the at least one row of the array of memory cells, and wherein each of the set of word-lines and each of the set of return word-lines is coupled to a respective stacked driver configured to provide current to a respective row of the array of memory cells; and
a set of bit-lines, wherein each of the set of the bit-lines is coupled to a second plurality of memory cells in at least one column of the array of memory cells, wherein each of the first plurality of the memory cells and each of the second plurality of the memory cells comprises:
at least one memory storage element comprising at least one readout superconducting quantum interference device (SQUID), and a magnetic Josephson Junction (MJJ), and wherein the at least one memory storage element further comprises a differential transformer coupled with the MJJ such that in response to a bit-line current applied to at least one of the set of the bit-lines and a word-line current applied, via a respective stacked driver, to at least one of the set of word-lines coupled to at least one of the set of return word lines, the differential transformer is configured to induce a flux in the at least one readout SQUID.

16. The memory system of claim 15, wherein the at least one SQUID comprises a first Josephson junction (JJ) and a second Josephson junction (JJ), and wherein the differential transformer comprises a first primary coupling coupled to the at least one of the set of word lines and a second primary coupling coupled to the at least one of the set of the return word-lines.

17. The memory system of claim 16, wherein the memory storage element is configured to meet or exceed a critical current threshold of the at least one of the first JJ or the second JJ based on a combination of at least a portion of the bit-line current, at least a portion of a current generated by induced flux from the word-line current, and at least a portion of a current provided by the MJJ to the at least one of the first JJ or the second JJ.

18. The memory system of claim 17, wherein prior to the read operation, the at least one memory storage element is in a first state or a second state, and wherein the first state corresponds to a logic one state and the second state corresponds to a logic zero state.

19. The memory system of claim 15, wherein the at least one of the set of word-lines is coupled to the at least one of the set of return word-lines via at least one capacitive element.

20. The memory system of claim 15, wherein the MJJ comprises at least one magnetic barrier layer, and wherein the first state comprises a first magnetization state corresponding to a first configuration of magnetization of the at least one magnetic barrier layer and the second state comprises a second magnetization state corresponding to a second configuration of magnetization of the at least one magnetic barrier layer, and wherein the first configuration of the magnetization is different from the second configuration of the magnetization.

* * * * *